United States Patent
Chen et al.

(10) Patent No.: US 9,653,571 B2
(45) Date of Patent: May 16, 2017

(54) FREESTANDING SPACER HAVING SUB-LITHOGRAPHIC LATERAL DIMENSION AND METHOD OF FORMING SAME

(71) Applicants: International Business Machines Corporation, Armonk, NY (US); Samsung Electronics Co., Ltd., Gyeonggi-do (KR); GLOBALFOUNDRIES Inc., Grand Cayman (KY)

(72) Inventors: Hsueh-Chung Chen, Cohoes, NY (US); Su Chen Fan, Cohoes, NY (US); Dong Kwon Kim, East Greenbush, NY (US); Sean Lian, Cohoes, NY (US); Fee Li Lie, Albany, NY (US); Linus Jang, Clifton Park, NY (US)

(73) Assignees: International Business Machines Corporation, Armonk, NY (US); Samsung Electronics Co., Ltd., Gyeonggi-do (KR); GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/739,662

(22) Filed: Jun. 15, 2015

(65) Prior Publication Data

US 2016/0365425 A1 Dec. 15, 2016

(51) Int. Cl.
*H01L 29/06* (2006.01)
*H01L 29/66* (2006.01)
(Continued)

(52) U.S. Cl.
CPC .... *H01L 29/6653* (2013.01); *H01L 21/02178* (2013.01); *H01L 21/02181* (2013.01);
(Continued)

(58) Field of Classification Search
CPC ............ H01L 29/6653; H01L 21/3086; H01L 21/31116; H01L 21/02186;
(Continued)

(56) References Cited

U.S. PATENT DOCUMENTS 7,265,013 B2 9/2007 Furukawa et al.
2008/0076221 A1* 3/2008 Kang .................... B82Y 10/00
438/267

OTHER PUBLICATIONS

Basker et al., "A 0.063 µm2 FinFET SRAM cell demonstration with conventional lithography using a novel integration scheme with aggressively scaled fin and gate pitch," 2010, pp. 19-20, IEEE, 2010 Symposium on VLSI Technology Digest of Technical Papers.

* cited by examiner

*Primary Examiner* — Thanh Y Tran
(74) *Attorney, Agent, or Firm* — Steven J. Meyers; Hoffman Warnick LLC

(57) ABSTRACT

An aspect of the invention includes a freestanding spacer having a sub-lithographic dimension for a sidewall image transfer process. The freestanding spacer comprises: a first spacer layer having a first portion disposed on the semiconductor layer; and a second spacer layer having a first surface disposed on the first portion of the first spacer layer, wherein the first spacer layer has a first dielectric constant and the second spacer layer has a second dielectric constant, the first dielectric constant being greater than the second dielectric constant, and wherein a dimension of each of the first and second spacer layers collectively determine the sub-lithographic lateral dimension of the freestanding spacer.

20 Claims, 11 Drawing Sheets

(51) Int. Cl.
*H01L 21/311* (2006.01)
*H01L 21/02* (2006.01)
*H01L 21/308* (2006.01)

(52) U.S. Cl.
CPC .. *H01L 21/02183* (2013.01); *H01L 21/02186* (2013.01); *H01L 21/3086* (2013.01); *H01L 21/31116* (2013.01)

(58) Field of Classification Search
CPC ......... H01L 21/02183; H01L 21/02178; H01L 21/02181
See application file for complete search history.

FREESTANDING SPACER HAVING SUB-LITHOGRAPHIC LATERAL DIMENSION AND METHOD OF FORMING SAME

BACKGROUND

Technical Field

The present invention relates to freestanding spacers, and more specifically, to methods of forming a freestanding spacer during sidewall image transfer for sub-lithographic structure formation.

Related Art

Photolithography is a technique for transferring an image rendered on one media onto another media photographically. Photolithography techniques are widely used in semiconductor fabrication. Typically, a circuit pattern is rendered as a positive or negative mask image which is then projected onto a silicon substrate coated with photosensitive materials (e.g., PR). Radiation impinges on the masked surface to chemically change those areas of the coating exposed to the radiation, usually by polymerizing the exposed coating. The un-polymerized areas are removed, being more soluble in the developer than the polymerized regions, and the desired image pattern remains.

In the microelectronics industry as well as in other industries involving construction of microscopic structures (e.g., micromachines, magnetoresistive heads, etc.) there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, FETs and capacitors, for example. Circuit chips with hundreds of millions of such devices are common.

In order to achieve further size reductions exceeding the physical limits of trace lines and micro-devices that are embedded upon and within their semiconductor substrates, techniques that exceed lithographic capabilities have been employed. Sidewall image transfer (SIT), also known as self-aligned double patterning (SADP), is one such technique to generate sub-lithographic structures. SIT involves the usage of a sacrificial structure (e.g., a mandrel, typically composed of a polycrystalline silicon), and a sidewall spacer (such as silicon dioxide or silicon nitride, for example) having a thickness less than that permitted by the current lithographic ground rules formed on the sides of the mandrel (e.g., via oxidization or film deposition and etching). After removal of the mandrel, the remaining sidewall spacer is used as a hard mask (HM) to etch the layer(s) below, for example, with a directional reactive ion etch (RIE). Since the sidewall spacer has a sub-lithographic lateral dimension, i.e., width, (less than lithography allows), the structure formed in the layer below will also have a sub-lithographic lateral dimension. In addition, the sidewall spacer at both sides of the sacrificial structure doubles pattern density, resulting in final pitch that is half of the original sacrificial pattern pitch. This reduction in pitch is one major drawback of the SIT process and is known as "pitch walking." Pitch walking is a phenomenon wherein the final critical dimension and spacer size is smaller than the initial critical dimension and spacer size at the beginning of the SIT process, resulting in two sets of critical dimensions and spacer sizes. For front end of the line (FEOL) SIT processes, the reduction in the sub-lithographic lateral dimension of the sidewall spacer is about 10 nanometers (nm). This reduction is a hurdle for FEOL pitch-scaling to below 50 nm.

SUMMARY

A first aspect of the invention includes a method of forming a sub-lithographic structure on a substrate. The method comprises the steps of: forming at least one mandrel over a semiconductor layer; depositing a first spacer layer over each of the at least one mandrels and over the semiconductor layer; depositing a second spacer layer over the first spacer layer, wherein the first spacer layer has a first dielectric constant and the second spacer layer has a second dielectric constant, the first dielectric constant being greater than the second dielectric constant; removing a portion of the first spacer layer and the second spacer layer to expose an upper surface of each of the at least one mandrel; and removing each of the at least one mandrels such that the first and second spacer layers remain, thereby forming the freestanding spacer, the first and second spacer layers together defining a sub-lithographic lateral dimension of the freestanding spacer.

A second aspect of the invention includes a method of forming a freestanding spacer for a sub-lithographic structure on a substrate. The method comprises the steps of: forming at least one mandrel over a semiconductor layer; depositing a first spacer layer over each of the at least one mandrels and over the semiconductor layer; depositing a second spacer layer over the first spacer layer, wherein the first spacer layer has a first dielectric constant and the second spacer layer has a second dielectric constant, the first dielectric constant being greater than the second dielectric constant; removing a portion of the first spacer layer and the second spacer layer to expose an upper surface of each of the at least one mandrels; removing each of the at least one mandrels such that the first and second spacer layers remain thereby forming the freestanding spacer, wherein a remaining portion of each of the first and second spacer layers collectively define first sub-lithographic lateral dimension; and removing a portion of the semiconductor layer using the first and second spacer layers to form the sub-lithographic structure.

A third aspect of the invention includes a freestanding spacer having a sub-lithographic dimension for a sidewall image transfer process. The freestanding spacer comprises: a first spacer layer having a first portion disposed over the semiconductor layer; and a second spacer layer having a first surface disposed on the first portion of the first spacer layer, wherein the first spacer layer has a first dielectric constant and the second spacer layer has a second dielectric constant, the first dielectric constant being greater than the second dielectric constant, and wherein a dimension of each of the first and second spacer layers collectively determine the sub-lithographic lateral dimension of the freestanding spacer.

BRIEF DESCRIPTION OF THE DRAWINGS

The embodiments of this invention will be described in detail, with reference to the following figures, wherein like designations denote like elements, and wherein.

DETAILED DESCRIPTION

Figure 1:
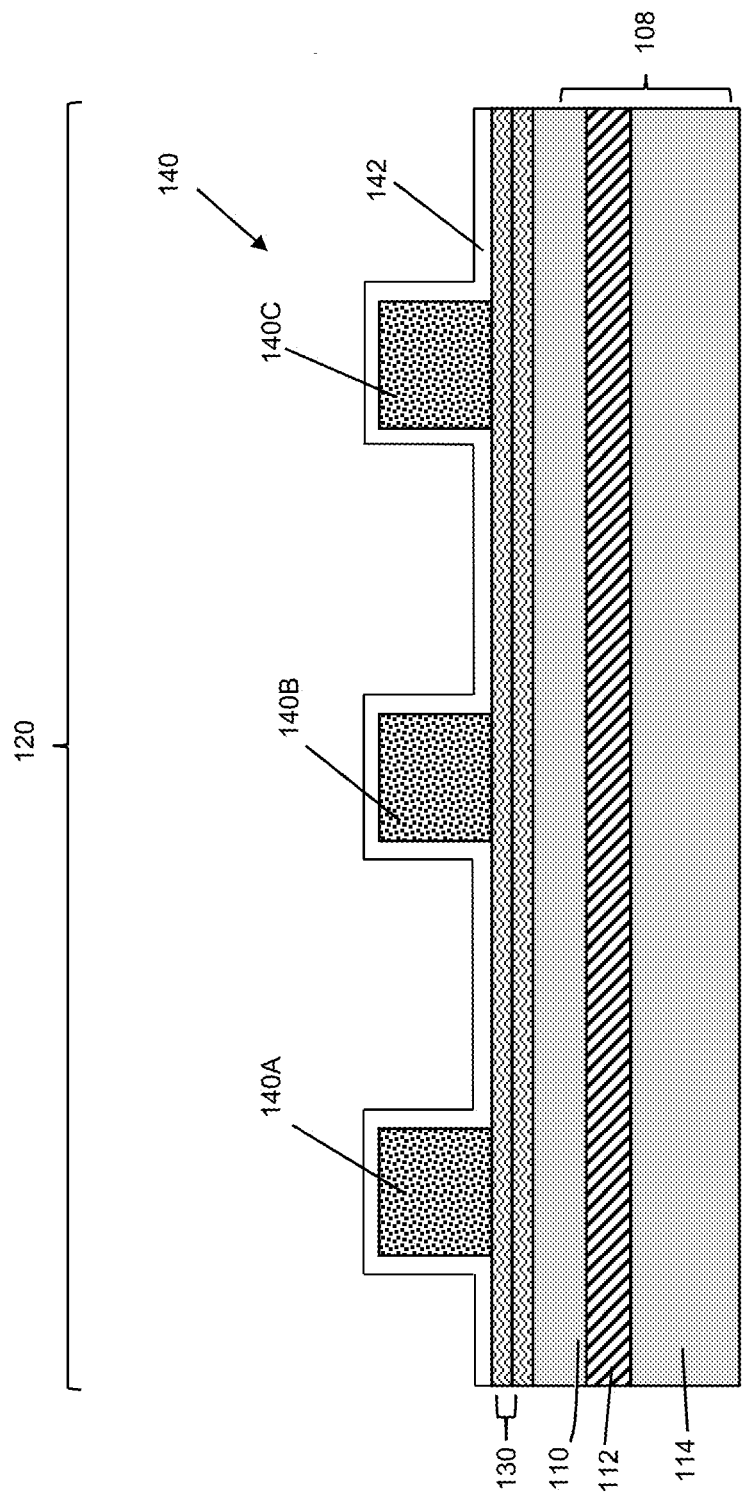
FIGS. 1-7 show cross-sectional views of a semiconductor structure undergoing processing according to embodiments of the invention.

Referring to the drawings, a structure for and a method of forming a freestanding spacer having a sub-lithographic lateral dimension for formation of sub-lithographic structures according to embodiments of the invention is illustrated. As used herein, "sub-lithographic lateral dimension" refers the width of the respective semiconductor structure, i.e., spacer or sub-lithographic structure. During conventional SIT processes, where the freestanding spacer typically includes a thin conformal oxide, the sub-lithographic lateral dimension of the resulting sub-lithographic structure is less than the sub-lithographic lateral dimension of the freestanding spacer used to create the resulting sub-lithographic structure. This reduction in the sub-lithographic lateral dimension occurs due to the structures undergoing several etch processes. Embodiments of the present invention include a freestanding spacer having at least a first spacer layer and a second spacer layer, wherein the first spacer layer includes a material that preserves the sub-lithographic lateral dimension of the freestanding spacer during etching resulting in a sub-lithographic structure having a sub-lithographic lateral dimension substantially equal to the sub-lithographic lateral dimension of the freestanding spacer. As used herein, the term "substantially" refers to largely, for the most part, or entirely specified, e.g., any amount of that is functionally indistinguishable from complete.

As shown in FIG. 1, a method may originate with a semiconductor-on-insulator (SOI) substrate 108. SOI substrate 108 may include a semiconductor-on-insulator (SOI) layer 110 (hereinafter "semiconductor layer 110") that overlays an insulator layer 112. Insulator layer 112 may be positioned over a substrate 114. Semiconductor layer 110 and substrate 114 may include any now known or later developed semiconductor material including but not limited to silicon, germanium, silicon germanium, silicon carbide, and those consisting essentially of one or more III-V compound semiconductors having a composition defined by the formula $Al_{X1}Ga_{X2}In_{X3}AS_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor layer/substrate may be strained. For example, semiconductor layer 110 may be strained. Insulator layer 112 material may include, for example, silicon oxide $SiO_2$. However, insulator layer 112 may include any interlayer dielectric such as but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. The precise thickness of insulating layer 112 and semiconductor layer 110 may vary widely with the intended application.

SOI substrate 108 including a silicon oxide insulator layer 112 can be produced by several methods. First, separation by implantation of oxygen (SIMOX) uses an oxygen ion beam implantation process followed by high temperature annealing to create a buried $SiO_2$ layer. Wafer bonding includes forming insulating layer 112 on a second substrate and by directly bonding to first substrate 114 with insulator layer 112 contacting to first substrate 114. The majority of the second substrate is subsequently removed, the remnants forming the topmost semiconductor layer 110. Seed methods may also be employed in which semiconductor layer 110 is grown directly on insulator layer 112. Seed methods require some sort of template for homo-epitaxy, which may be achieved by chemical treatment of insulator layer 112, an appropriately oriented crystalline insulator, or vias through the insulator from the underlying substrate. While the description of embodiments of the invention will be illustrated relative to an SOI substrate 108 (hereinafter "substrate 108"), it is emphasized that teachings of the invention are equally applicable to a bulk semiconductor substrate.

FIG. 1 also shows forming a hard mask 130 over semiconductor layer 110. Hard mask 130 may be formed prior to forming a plurality of mandrels 140, as will be described. The term "mask" may be given to a layer of material which is applied over an underlying layer of material, and patterned to have openings, so that the underlying layer can be processed where there are openings. After processing the underlying layer, the mask may be removed. Common masking materials are nitride, oxide, low-k or high-k dielectrics. These materials are usually considered to be a "hard mask." In the instant case, hard mask 130 may include, for example, a pad silicon nitride ($Si_3N_4$) layer over a thinner, pad oxide ($SiO_2$) layer. While hard mask 130 may have various thicknesses, in one example, the pad oxide layer may be approximately 2 nm to approximately 5 nm of chemical vapor deposition (CVD) oxide or thermal oxide, and the pad nitride layer may be approximately 20 to approximately 50 nm.

As also shown in FIG. 1, methods according to embodiments of the invention may include forming a plurality of mandrels 140 over hard mask 130 over semiconductor layer 110. Mandrel formation may be performed as part of a sidewall image transfer (SIT) process. While three mandrels 140A-140C have been illustrated, it is understood that any number of mandrels may be provided. Each mandrel 140A-C may have a spacer 148 (FIG. 5) adjacent thereto as will be described herein. Mandrels 140A-C may be formed by depositing sacrificial material and then patterning the sacrificial material into the plurality of material blocks in any now known or later developed manner. In one embodiment mandrels 140A-C, may include polysilicon, amorphous silicon, amorphous carbon, etc. "Depositing" may include any now known or later developed techniques appropriate for the material to be deposited including but are not limited to, for example: CVD, low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. The patterning may include using any conventional photoresist, exposing it and etching accordingly to create mandrels 140, followed by photoresist strip.

Figure 2:
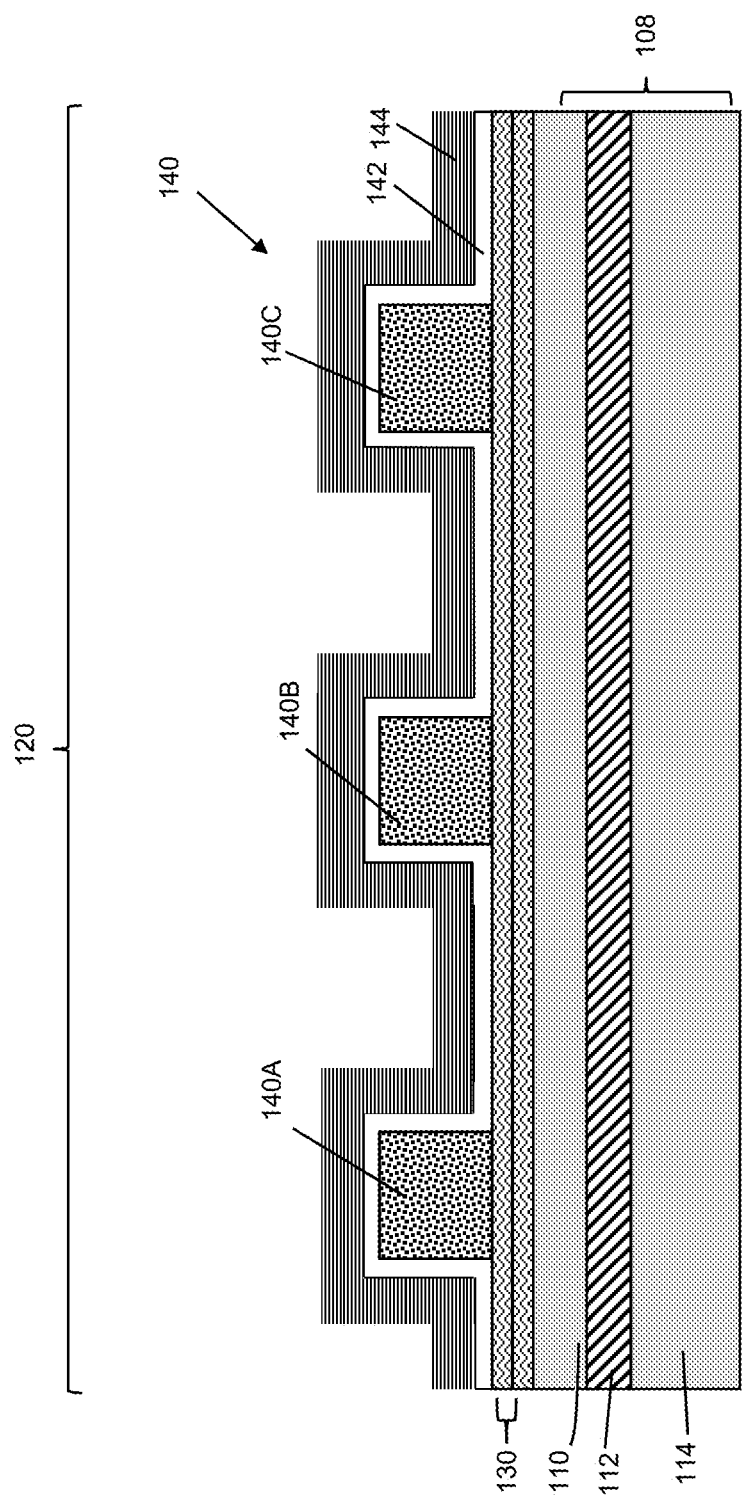

Spacers 148 (FIG. 5) may then be formed over semiconductor layer 110 and, more particularly, hard mask 130 adjacent to the walls of mandrels 140A-C. Referring back to FIG. 1, a first step of spacer 148 formation is shown. Spacers 148 may be formed, for example, by depositing a first spacer layer 142 over each mandrel 140 such as an un-annealed material having a high dielectric constant, including, but not limited to aluminum oxide, titanium oxide, tantalum pentoxide, and hafnium oxide. First spacer layer 142 may include a material having a dielectric constant of approximately 10 to approximately 50. In some embodiments, first spacer layer 142 may have a dielectric constant of approximately 30 to approximately 50. As used herein, "approximately" is intended to include values, for example, within 10% of the stated values. Further, as shown in FIG. 2, a second spacer layer 144 may be deposited over first spacer layer 142. Second spacer layer 144 may include a thin conformal oxide layer, such as silicon dioxide. Second spacer layer 144 may have a dielectric constant of approximately less than 10. That is, first spacer layer 142 may have a dielectric constant that is greater than a dielectric constant of second spacer layer 144. The material used for first spacer layer 142 may be selective to the material used for second spacer layer 144. That is, the material chosen for first spacer layer 142 is one which substantially prevents the etch of second spacer layer 144 as will be described herein. Once mandrels 140A-C are removed, second spacer layer 144 is susceptible to being trimmed during downstream pattern transfers. First spacer layer 142 prevents second spacer layer 144 from being trimmed as first spacer layer 142 is disposed adjacent to and underneath second spacer layer 144. Second spacer layer 144 is sacrificial, and is used for pattern transfer as will be described herein.

Figure 3:
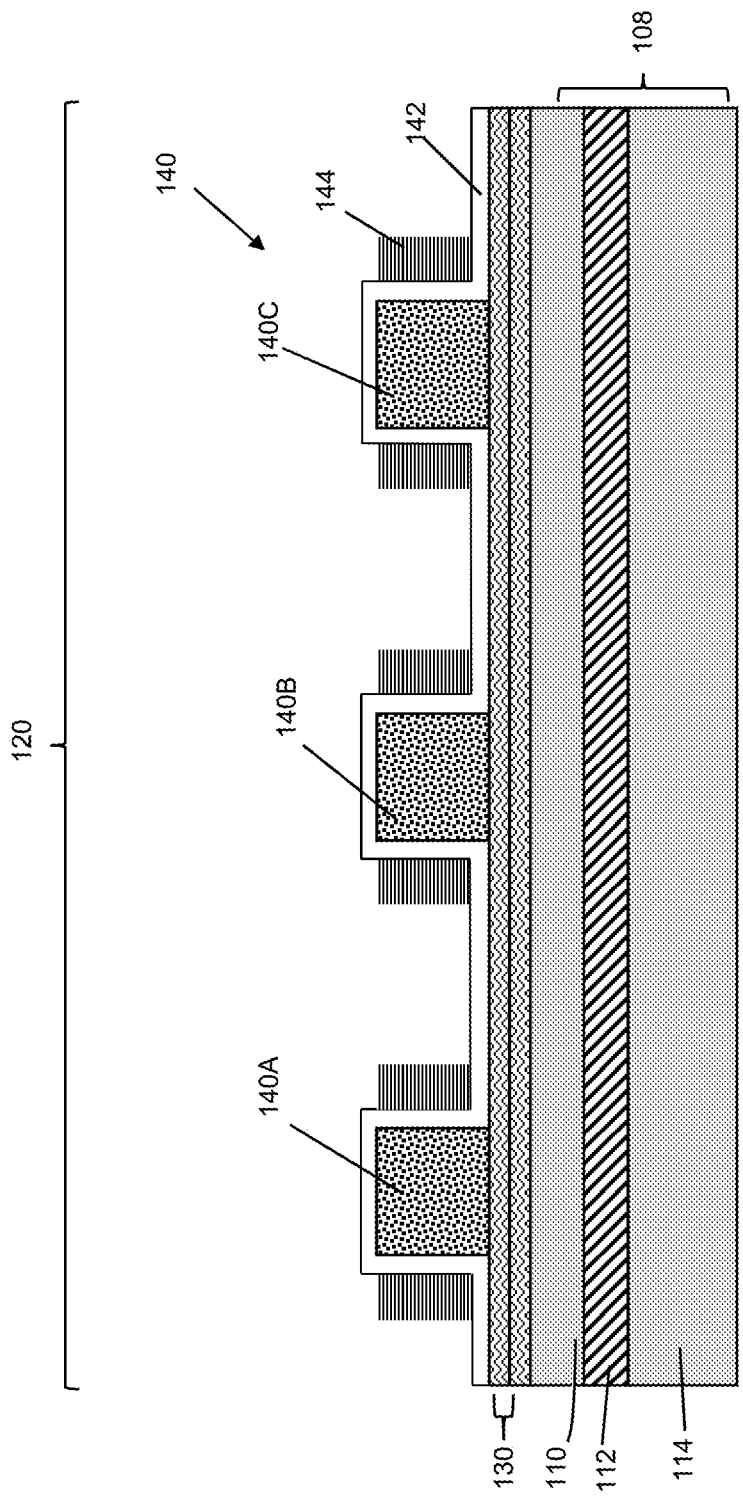
Figure 4:
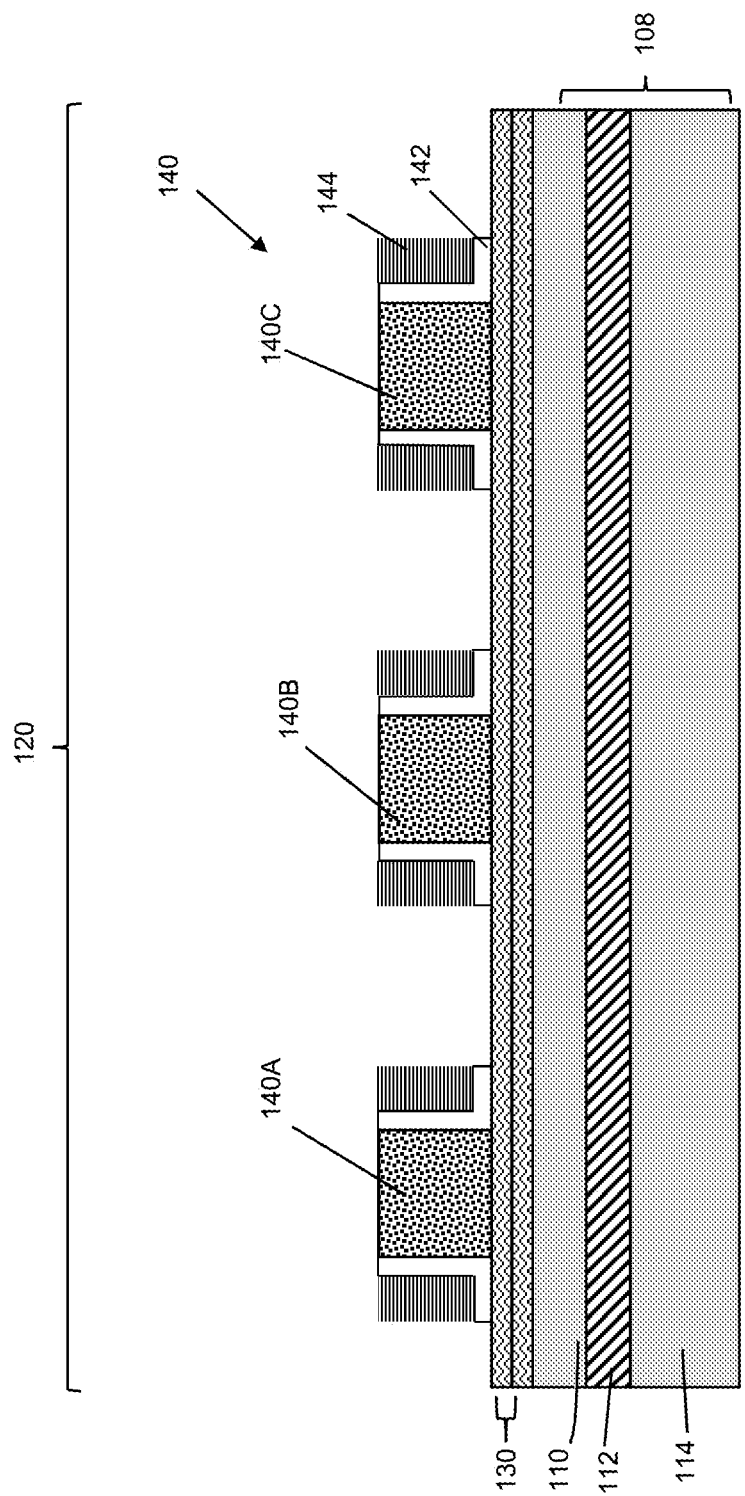

As shown in FIG. 3, an etching may then be performed to remove a portion of second spacer layer 144. That is, a portion of second spacer layer 144 may be removed to expose first spacer layer 142 at an upper surface of each mandrel 140A-C and on the field of region 120. Referring to FIG. 4, an etching may be performed to remove a portion of first spacer layer 142. That is, the exposed portions of first spacer layer 142 may be removed to expose an upper surface of each mandrel 140A-C and to expose a surface of hardmask 130 on the field of region 120 between mandrels 140A-C. In either removal step, the etch may include, for example, an anisotropic or reactive-ion etch. Further, a single etch process may be performed to etch first spacer layer 142 and second spacer layer 144 at the same time to expose an upper surface of mandrels 140A-C.

Figure 5:
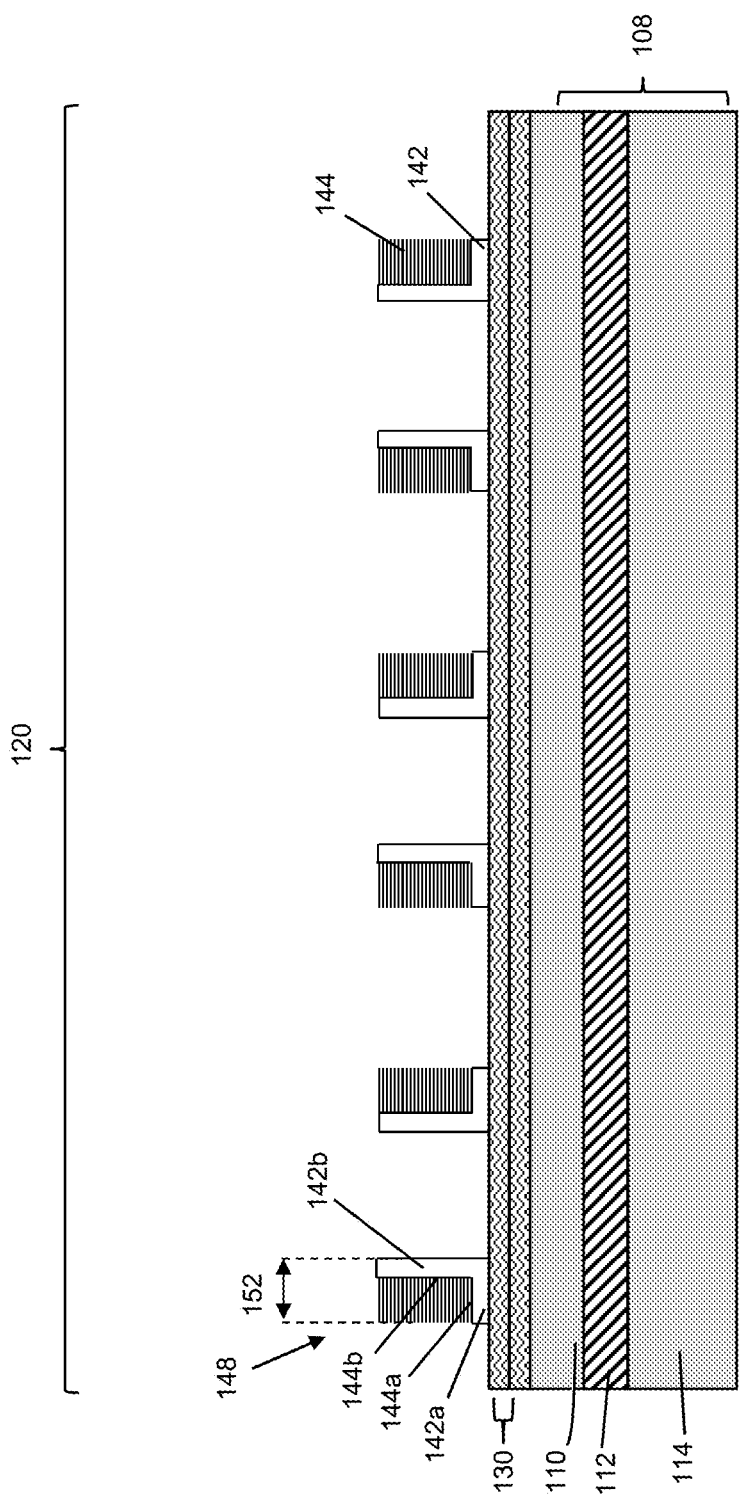

As shown in FIG. 5, a next step may include removing the uncovered group of the plurality of mandrels 140A-C leaving freestanding spacers 148 thereof. That is, each mandrel 140A-C may be removed such that first spacer layer 142 and second spacer layer 144 adjacent to sidewalls of mandrels 140A-C remain to create freestanding spacer 148. This step may be referred to as a "mandrel pull." Mandrels 140A, 140B, 140C may be removed using any conventional process selective to hard mask 130, e.g., a RIE, a hydrogen bromide (HBr) containing plasma, etc.

Freestanding spacers 148 may include remaining portions of first spacer layer 142 and second spacer layer 144. First spacer layer 142 may have a first portion 142a disposed over semiconductor layer 110 and a second portion 142b adjacent to second spacer layer 144. Second spacer layer 144 may have a first surface 144a disposed on first portion 142a of the first spacer layer 142 and a second surface 144b adjacent to first portion 142a of first spacer layer 142. That is, second portion 142b of first spacer layer 142 may substantially coat second surface 144b of second spacer layer 144.

Each spacer 148 may have a sub-lithographic lateral dimension 152. In this embodiment, sub-lithographic lateral dimension 152 may be defined by portions of first spacer layer 142 and second spacer layer 144 collectively. Sub-lithographic lateral dimension 152 of each spacer 148 is chosen to be the same as that of the desired width of a final sub-lithographic structure. In some embodiments, sub-lithographic lateral dimension 152 may be substantially equal to approximately 25 to approximately 35 nm. More particularly, sub-lithographic lateral dimension 152 may be substantially equal to approximately 30 nm. In the example shown, the sub-lithographic structure being generated are fins, but the teachings of the invention are applicable to a wide variety of SIT formed structures such as but not limited to gates, resistors, etc. In any event, these spacers 148 determine the final pattern widths and tolerances of the components being formed in substrate 108.

Figure 6:
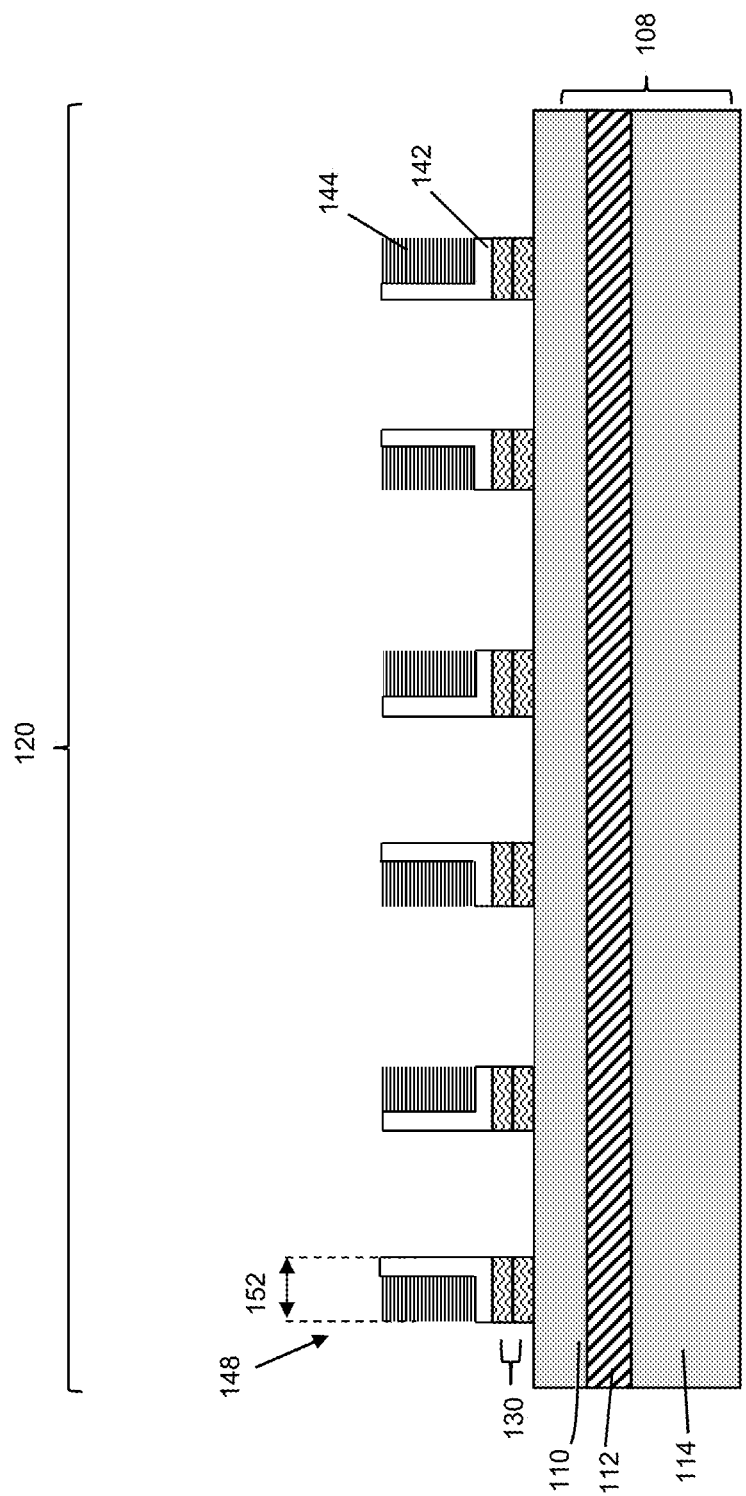
Figure 7:
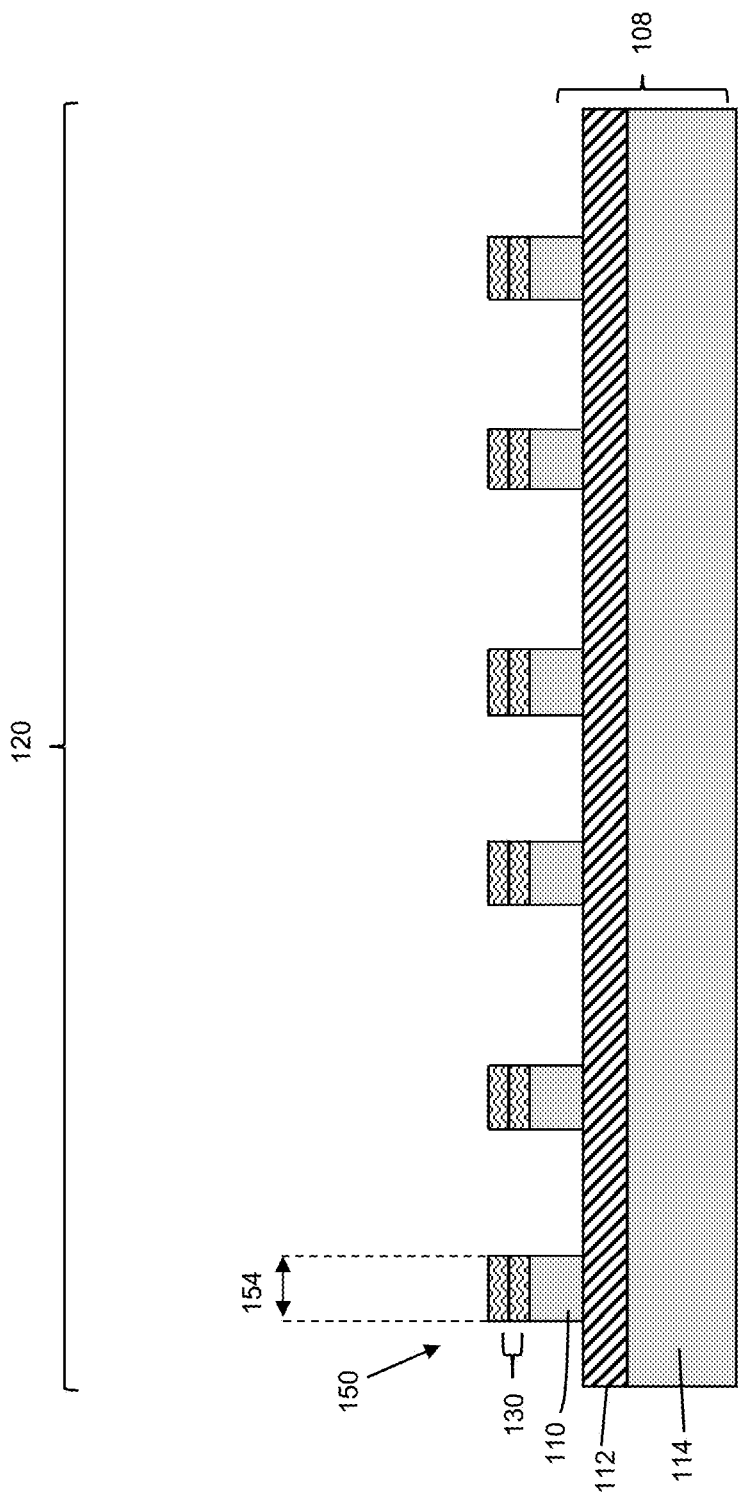

Once mandrels 140 are removed, region 120 may undergo several etch processes to pattern the sub-lithographic structures using spacers 148 as a pattern of the sub-lithographic structure as known in the art. For example, as shown in FIG. 6, an etch may be performed to remove hard mask 130 between plurality of spacers 148, i.e., etch to pattern the sub-lithographic structures into hard mask 130, using spacers 148 as a pattern of the sub-lithographic structure. Additionally, as shown in FIG. 7, another etch may be performed to remove semiconductor layer 110 using patterned hard mask 130 (where spacers 148 existed). That is, sub-lithographic structures 150 may be formed in semiconductor layer 110 using patterned hard mask 130. Either etch process may include any now known or later developed chemistry for etching hard mask 130 such as but not limited to a fluorocarbon reactive ion etch (RIE), etc. While two etches have been described, it is understood that one or more than two etches may be employed, where desired and appropriate chemistries can attain the desired results. Other etching processes may also be employed, such as a wet etch to remove spacers 148, e.g., hydrofluoric acid (HF) based for oxide spacers. Additionally, an optional etch (not shown) may be performed to remove remaining hard mask 130, e.g., by a conventional wet etch for nitride. It is possible, however, to allow hard mask 130 to remain for later use.

Sub-lithographic structures 150 may have a second sub-lithographic lateral dimension 154 that is substantially equal to first lateral dimension 152 (FIG. 4). During conventional SIT processes, the sub-lithographic lateral dimension of the sub-lithographic structures become compromised as the SIT region undergoes the hard mask etch and the semiconductor layer etch. Embodiments of the present invention prevent the reduction in sub-lithographic lateral dimension of the structures by virtue of depositing first spacer layer 142 before depositing second spacer layer 144 to create spacers 148. Due to first spacer layer 142 including a material that has a dielectric constant of approximately equal to or greater than 30, and being selective to the material used for second spacer layer 144, the sub-lithographic lateral dimension of the sub-lithographic structure is preserved such that the final sub-lithographic structure 150 has a sub-lithographic lateral dimension 154 that is substantially equal to sub-lithographic lateral dimension 152 of spacers 148.

Figure 8:
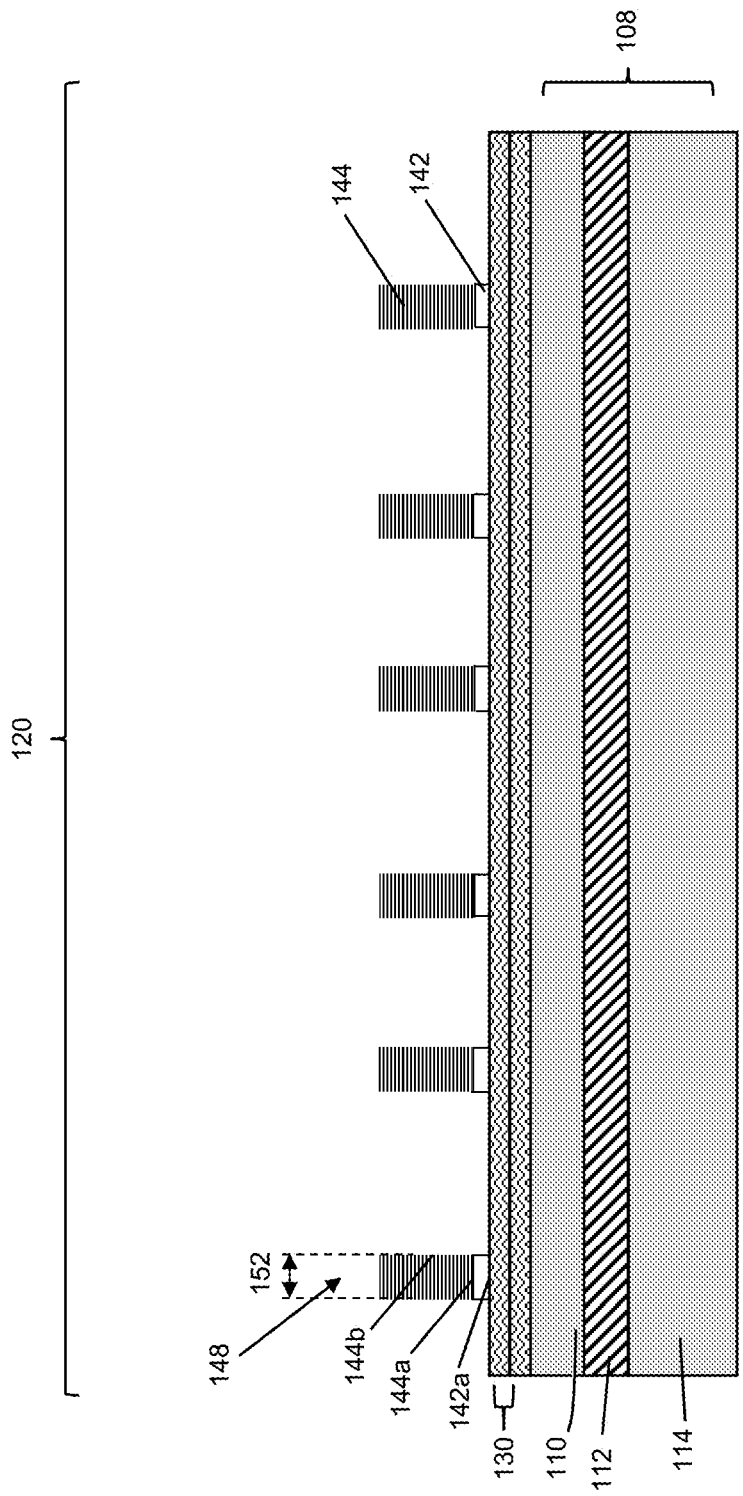
FIG. 8 shows a cross-sectional view of a semiconductor structure according to another embodiment of the invention.

FIG. 8 shows an alternative embodiment of the invention wherein spacers 148 undergo another etch process after the mandrel pull. Briefly, referring back to FIG. 5, in this embodiment, second portion 142b of first space layer 142 adjacent to second surface 144b of second spacer layer 142 is removed such that first portion 142a of first spacer layer 142 remains disposed between first surface 144a of second spacer layer 144 and semiconductor layer 110. Second portion 142b of first spacer layer 142 may be removed by reactive ion etch, for example, using $BCl_3$, $CF_4$ or $Cl_2$, $SF_6$. In this embodiment, sub-lithographic lateral dimension 152 is defined by the width of second spacer layer 144 on first spacer layer 142. Additionally, region 120 may undergo further etch processing as described with respect to FIGS. 6-7 such that sub-lithographic structures 150 are created. As previously described, the sub-lithographic lateral dimension of the final sub-lithographic structure (after hard mask etch and semiconductor etch) is substantially equal to the sub-lithographic lateral dimension after the mandrel pull.

Figure 9:
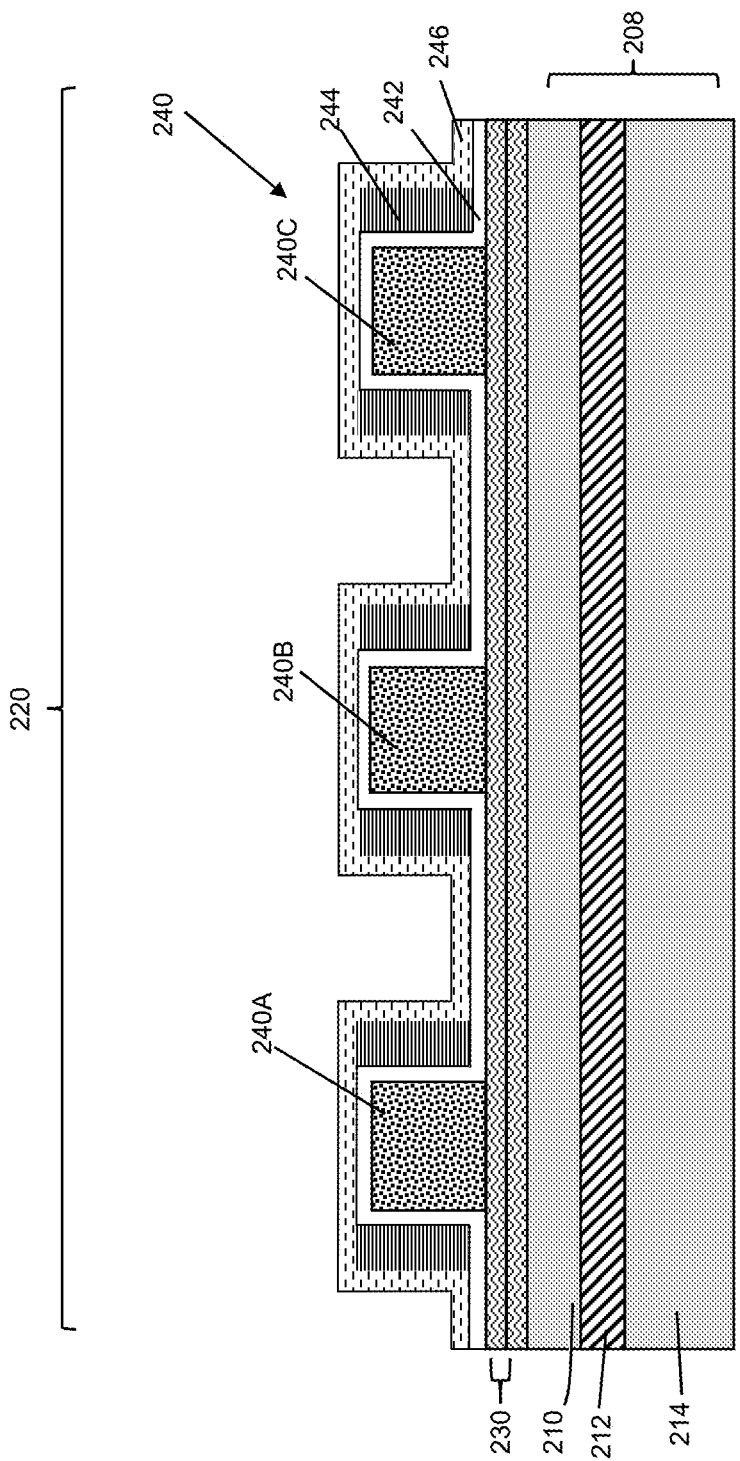
FIGS. 9-11 show a cross-sectional view of a semiconductor structure according to other embodiments of the invention.
Figure 10:
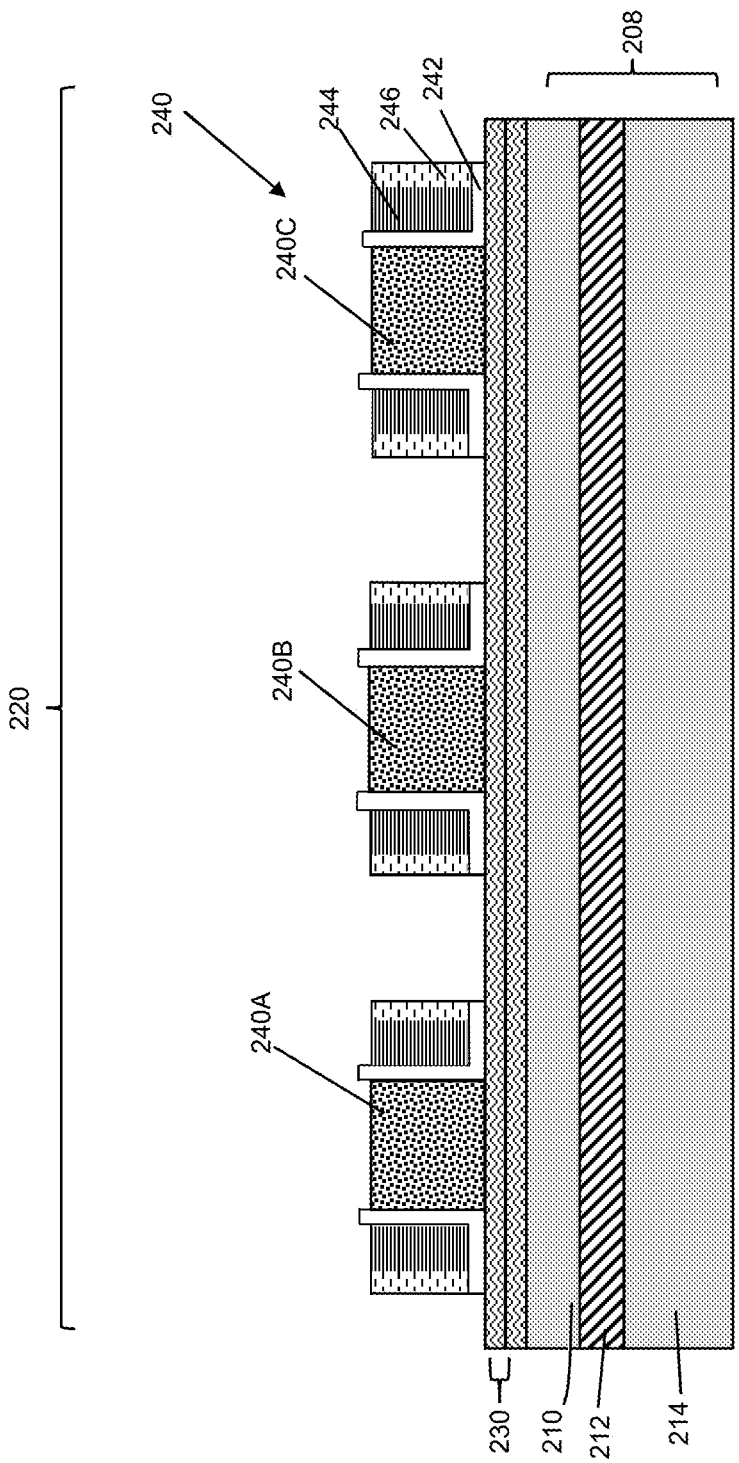
Figure 11:
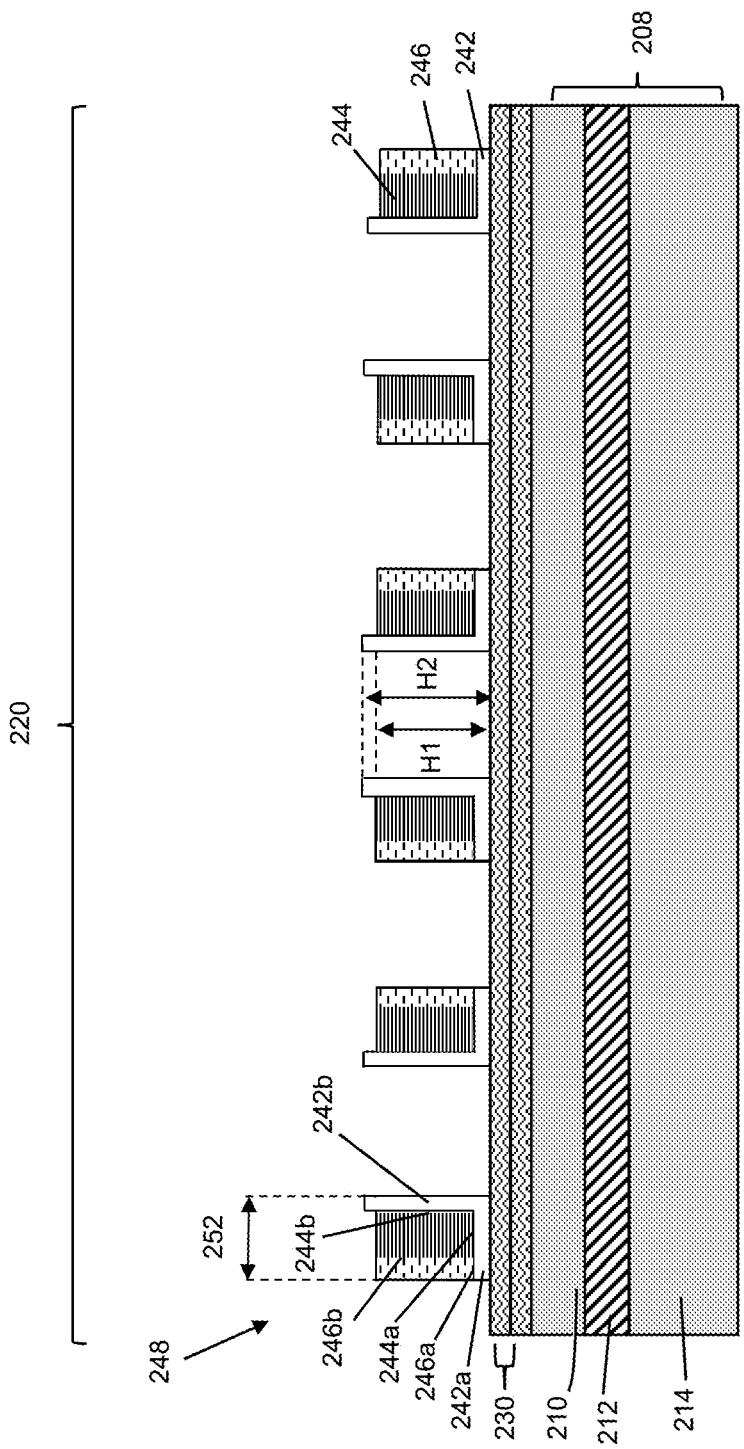

FIGS. 9-11 show another embodiment according to aspects of the invention. In this embodiment, first spacer layer 242 and second spacer layer 244 may be deposited as previously described with respect to FIGS. 1-2. However, in this embodiment, after second spacer layer 244 is removed from the upper surface of each mandrel 140A-C and the field of region 220, a third spacer layer 246 may be deposited on region 220 to substantially coat second spacer layer 244 (FIG. 9). That is, third spacer layer 246 may be deposited prior to removing the portion of first spacer layer 242 from an upper surface of mandrels 140A-C and the field of region 220. Third spacer layer 246 may include the same material as first spacer layer 242. Alternatively, third spacer layer 246 may include another un-annealed material having a dielectric constant approximately equal to or greater than 30.

As shown in FIG. 10, a portion of each of the first spacer layer 242 and third spacer layer 246 may be removed to expose an upper surface of each mandrel 240A-C. That is, after third spacer layer 246 is deposited, a portion of third spacer layer 246 may be removed to expose first spacer layer 242 on an upper surface of each mandrel 240A-C and on the field of region 220. Third spacer layer 246 may be removed by an anisotropic or reactive ion etch. Further, a portion of first spacer layer 242 may be removed from an upper surface of each mandrel 240A-C and from the field of region 220. In this embodiment, a radial line slot antenna (RLSA) etch may be performed to remove first spacer layer 242. As known in the art, RLSA etching utilizes a planar antenna having a several slots to supply microwaves to a processing chamber to turn etching gases contained in the chamber into plasma used to perform the etch on the wafer. RLSA allows for greater etching to be done on horizontal surfaces than on vertical surfaces. Therefore, in this embodiment, first spacer layer 242 of may extend in the vertical direction further than second spacer layer 244 and third spacer layer 246 as will be described herein. The increased height of first spacer layer 242 in the vertical direction may further prevent pitch walking.

As shown in FIG. 11, region 220 undergoes the mandrel pull as previously described with respect to FIG. 5. In this embodiment, third spacer layer 246, together with first spacer layer 242 and second spacer layer 244 collectively define a sub-lithographic lateral dimension 252 of freestanding spacer 248. As shown in FIG. 11, freestanding spacer 248 may include third spacer layer 246 substantially coating a sidewall of second spacer layer 244. Additionally, region 220 may undergo subsequent etch processes as described with respect to FIGS. 6-7 to create sub-lithographic structures. As in the previous embodiments, the resulting sub-lithographic lateral dimension of the final sub-lithographic structure (after hard mask etch and semiconductor etch) is substantially equal to the sub-lithographic lateral dimension after the mandrel pull.

After the mandrel pull, the remaining freestanding spacers 248 may include first spacer layer 242 having a first portion 242a disposed over semiconductor layer 210 and a second portion 242b adjacent to second spacer layer 244. Second spacer layer 244 may have a first surface 244a disposed on first portion 242a of the first spacer layer 242 and a second surface 244b adjacent to and substantially coating first portion 242a of first spacer layer 242. Additionally, freestanding spacer 248 may also include third spacer layer 246 having a first surface 246a disposed on first portion 242a of first spacer layer 242 and a second surface 246b adjacent to second spacer layer 244. That is, second spacer layer 244 may substantially separate second surface 246b of third spacer layer 246 from second portion 242b of first spacer layer 242. As discussed previously, first spacer layer 242 of may extend in the vertical direction further than second spacer layer 244 and third spacer layer 246. That is, second spacer layer 244 and third spacer layer 246 may together have a first height H1 and first spacer layer 242 may have a second height H2 that is greater than height H1. For example, in some embodiments, height H2 may be substantially equal to approximately 20 nm to approximately 200 nm and height H1 may be substantially equal to approximately 10 nm to approximately 195 nm.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming a freestanding spacer for a sub-lithographic structure on a substrate, the method comprising the steps of:
   forming at least one mandrel over a semiconductor layer;
   depositing a first spacer layer over each of the at least one mandrel and over the semiconductor layer;
   depositing a second spacer layer over the first spacer layer,
      wherein the first spacer layer has a first dielectric constant and the second spacer layer has a second dielectric constant, the first dielectric constant being greater than the second dielectric constant and the first dielectric constant being between approximately 10 and approximately 50;
   removing a portion of the first spacer layer and the second spacer layer to expose an upper surface of each of the at least one mandrel; and
   removing each of the at least one mandrel such that the first and second spacer layers remain, thereby forming the freestanding spacer, the first and second spacer layers together defining a sub-lithographic lateral dimension of the freestanding spacer.

2. The method of claim 1, further comprising:
   depositing a third spacer layer over the second spacer layer prior to the removing of the portion of the first spacer layer.

3. The method of claim 2, further comprising:
   removing a portion of the third spacer layer from the upper surface of each of the at least one mandrel prior to removing each of the at least one mandrel.

4. The method of claim 1, further comprising:
   removing the first spacer layer from an area adjacent to the second spacer layer subsequent to the removing of each of the at least one mandrel such that a portion of the first spacer layer remains disposed between the second spacer layer and the semiconductor layer.

5. The method of claim 1, wherein the depositing the first spacer layer includes depositing at least one of aluminum oxide, titanium oxide, tantalum pentoxide and hafnium oxide.

6. The method of claim 1, wherein the removing a portion of the first and second spacer layers includes reactive-ion etching the first and second spacer layers.

7. The method of claim 1, wherein the first spacer layer is of a material that is selective to a material of the second spacer layer such that the first spacer layer substantially prevents etching of the second spacer layer.

8. A method of forming a freestanding spacer for a sub-lithographic structure on a substrate, the method comprising the steps of:
   forming at least one mandrel over a semiconductor layer;
   depositing a first spacer layer over each of the at least one mandrel and over the semiconductor layer;
   depositing a second spacer layer over the first spacer layer,
      wherein the first spacer layer has a first dielectric constant and the second spacer layer has a second dielectric constant, the first dielectric constant being greater than the second dielectric constant;
   removing a portion of the first spacer layer and the second spacer layer to expose an upper surface of each of the at least one mandrel;
   removing each of the at least one mandrel such that the first and second spacer layers remain thereby forming the freestanding spacer,
      wherein a remaining portion of each of the first and second spacer layers collectively define a first sub-lithographic lateral dimension; and
   removing a portion of the semiconductor layer using the first and second spacer layers to form the sub-lithographic structure.

9. The method of claim 8, wherein the removing the portion of the semiconductor layer includes removing the portion of the semiconductor layer such that a second sub-lithographic lateral dimension of the sub-lithographic structure is substantially equal to the first sub-lithographic lateral dimension of the freestanding spacer.

10. The method of claim 8, further comprising:
    depositing a third spacer layer over the second spacer layer prior to the removing of the portion of the first spacer layer,
    wherein a portion of the third spacer layer and the remaining portion of each of the first and second spacer layers collectively determine the first sub-lithographic lateral dimension of the freestanding spacer.

11. The method of claim 10, further comprising:
    removing a portion of the third spacer layer from the upper surface of each of the at least one mandrel, and
    wherein the removing the portion of the semiconductor layer includes removing the portion of the semiconductor layer such that a second sub-lithographic lateral dimension of the sub-lithographic structure is substantially equal to the first sub-lithographic lateral dimension of the freestanding spacer.

12. The method of claim 8, further comprising:
    removing the first spacer layer from an area adjacent to the second spacer layer subsequent to the removing of each of the at least one mandrel such that a portion of the first spacer layer remains disposed between the second spacer layer and the semiconductor layer.

13. The method of claim 8, wherein the depositing the first spacer layer includes depositing material having a dielectric constant of approximately 10 to approximately 50.

14. The method of claim 8, wherein the depositing the first spacer layer includes depositing at least one of aluminum oxide, titanium oxide, tantalum pentoxide and hafnium oxide.

15. A freestanding spacer having a sub-lithographic lateral dimension for a sidewall image transfer process, the freestanding spacer comprising:
    a first spacer layer having a first portion disposed over the semiconductor layer; and
    a second spacer layer having a first surface disposed on the first portion of the of the first spacer layer,
    wherein the first spacer layer has a first dielectric constant and the second spacer layer has a second dielectric constant, the first dielectric constant being greater than the second dielectric constant and the first dielectric constant being between approximately 10 and approximately 50, and
    wherein a dimension of each of the first and second spacer layers collectively determine the sub-lithographic lateral dimension of the freestanding spacer.

16. The freestanding spacer of claim 15, wherein the first spacer layer includes at least one of: aluminum oxide, titanium oxide, tantalum pentoxide or hafnium oxide.

17. The freestanding spacer of claim 15, wherein the sub-lithographic lateral dimension is substantially equal to approximately 30 nanometers.

18. The freestanding spacer of claim 15, further comprising:
- a third spacer layer substantially coating a sidewall of the second spacer layer,
- wherein the third spacer layer together with the first spacer layer and the second spacer layer collectively define the sub-lithographic lateral dimension of the freestanding spacer.

19. The freestanding spacer of claim 15, wherein the first spacer layer further includes a second portion adjacent to a second surface of the second spacer layer of the freestanding spacer.

20. The freestanding spacer of claim 15, wherein the first spacer layer is of a material that is selective to a material of the second spacer layer such that the first spacer layer substantially prevents etching of the second spacer layer.

* * * * *